United States Patent
Kang et al.

(10) Patent No.: US 8,519,470 B2
(45) Date of Patent: Aug. 27, 2013

(54) SEMICONDUCTOR CHIP, AND SEMICONDUCTOR PACKAGE AND SYSTEM EACH INCLUDING THE SEMICONDUCTOR CHIP

(75) Inventors: Sun-won Kang, Seongnam-si (KR); Hwan-sik Lim, Gunpo-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 53 days.

(21) Appl. No.: 13/076,605

(22) Filed: Mar. 31, 2011

(65) Prior Publication Data
US 2011/0283034 A1 Nov. 17, 2011

(30) Foreign Application Priority Data
May 12, 2010 (KR) .................. 10-2010-0044498

(51) Int. Cl.
*H01L 29/788* (2006.01)

(52) U.S. Cl.
USPC ........... 257/320; 257/737; 257/738; 257/686; 257/690; 257/781; 257/200; 257/735; 257/620; 438/613; 438/109; 438/121; 438/107; 438/763; 438/125; 438/612

(58) Field of Classification Search
USPC .................. 257/320, 737, 738, 686, 690, 778, 257/781, 200, 735, 620; 438/613, 109, 121, 438/107, 763, 125, 612
See application file for complete search history.

(56) References Cited

U.S. PATENT DOCUMENTS

| | | | | |
|---|---|---|---|---|
| 6,091,318 | A * | 7/2000 | Lee et al. | 338/309 |
| 6,232,243 | B1 * | 5/2001 | Farnworth et al. | 438/763 |
| 6,590,295 | B1 * | 7/2003 | Liao et al. | 257/781 |
| 6,638,847 | B1 * | 10/2003 | Cheung et al. | 438/612 |
| 6,653,563 | B2 * | 11/2003 | Bohr | 174/520 |
| 6,736,306 | B2 * | 5/2004 | Byun et al. | 228/180.22 |
| 7,242,099 | B2 * | 7/2007 | Lin et al. | 257/778 |
| 7,615,865 | B2 * | 11/2009 | Kang et al. | 257/737 |
| 7,642,632 | B2 * | 1/2010 | Kang | 257/686 |
| 8,026,128 | B2 * | 9/2011 | Pendse | 438/107 |
| 8,125,068 | B2 * | 2/2012 | Lee | 257/686 |
| 8,129,840 | B2 * | 3/2012 | Jo et al. | 257/737 |
| 8,178,971 | B2 * | 5/2012 | Fujii | 257/738 |
| 8,198,131 | B2 * | 6/2012 | Weng et al. | 438/107 |
| 8,222,737 | B2 * | 7/2012 | Watanabe et al. | 257/735 |
| 2002/0141171 | A1 * | 10/2002 | Bohr | 361/820 |
| 2003/0092326 | A1 * | 5/2003 | Nishikawa et al. | 439/894 |
| 2003/0094631 | A1 * | 5/2003 | Akram et al. | 257/200 |
| 2004/0157363 | A1 * | 8/2004 | Yamaguchi | 438/106 |
| 2004/0266160 | A1 * | 12/2004 | Jao et al. | 438/613 |
| 2004/0266162 | A1 * | 12/2004 | Feng | 438/613 |

(Continued)

FOREIGN PATENT DOCUMENTS

| | | |
|---|---|---|
| JP | 2000-243771 | 9/2000 |
| JP | 2000-243898 | 9/2000 |
| KR | 10-0825768 | 4/2008 |

*Primary Examiner* — Fernando L Toledo
*Assistant Examiner* — Mohammed Shamsuzzaman
(74) *Attorney, Agent, or Firm* — Stanzione & Kim, LLP

(57) ABSTRACT

A semiconductor chip includes a redistribution interconnect that is implemented by shorting bumps, and a semiconductor package and a system each including the semiconductor chip. The semiconductor chip includes a semiconductor substrate, a passivation film disposed on the semiconductor substrate, and a plurality of pseudo bumps disposed on the passivation film. Each pseudo bump is directly connected to adjacent pseudo bumps to form at least one redistribution interconnect.

15 Claims, 12 Drawing Sheets

(56) References Cited

U.S. PATENT DOCUMENTS

| | | | |
|---|---|---|---|
| 2005/0093153 A1* | 5/2005 | Liu | 257/738 |
| 2006/0076679 A1* | 4/2006 | Batchelor et al. | 257/737 |
| 2006/0170102 A1* | 8/2006 | Ko | 257/738 |
| 2006/0231949 A1* | 10/2006 | Park et al. | 257/737 |
| 2006/0286791 A1* | 12/2006 | Feng | 438/613 |
| 2007/0023924 A1* | 2/2007 | Funaki | 257/778 |
| 2007/0029673 A1* | 2/2007 | Yamaguchi | 257/737 |
| 2007/0052095 A1* | 3/2007 | Torii et al. | 257/737 |
| 2007/0111502 A1* | 5/2007 | Daubenspeck et al. | 438/613 |
| 2008/0032457 A1* | 2/2008 | McWilliams et al. | 438/125 |
| 2009/0045513 A1* | 2/2009 | Kim et al. | 257/738 |
| 2009/0196000 A1* | 8/2009 | Pang et al. | 361/767 |
| 2009/0236739 A1* | 9/2009 | Chen et al. | 257/737 |
| 2010/0013094 A1* | 1/2010 | Jo et al. | 257/738 |
| 2010/0038778 A1* | 2/2010 | Lee et al. | 257/737 |
| 2010/0099222 A1* | 4/2010 | Pendse et al. | 438/121 |
| 2010/0123217 A1* | 5/2010 | Poeppel et al. | 257/536 |
| 2010/0295179 A1* | 11/2010 | Watanabe et al. | 257/738 |
| 2010/0308442 A1* | 12/2010 | Naka et al. | 257/620 |
| 2010/0314756 A1* | 12/2010 | Lii et al. | 257/737 |
| 2011/0024905 A1* | 2/2011 | Lin et al. | 257/738 |
| 2011/0095418 A1* | 4/2011 | Lim et al. | 257/737 |
| 2011/0115074 A1* | 5/2011 | Hu et al. | 257/737 |
| 2011/0117700 A1* | 5/2011 | Weng et al. | 438/109 |
| 2011/0248399 A1* | 10/2011 | Pendse | 257/737 |
| 2011/0278717 A1* | 11/2011 | Pagaila et al. | 257/737 |
| 2011/0291275 A1* | 12/2011 | Lin et al. | 257/738 |
| 2011/0309500 A1* | 12/2011 | Pendse | 257/737 |
| 2012/0031659 A1 | 2/2012 | Tanno et al. | 174/261 |
| 2012/0104590 A1* | 5/2012 | Do et al. | 257/690 |
| 2012/0129333 A1* | 5/2012 | Yim et al. | 438/613 |
| 2012/0129334 A1* | 5/2012 | Chung et al. | 438/613 |
| 2012/0133043 A1* | 5/2012 | Pendse et al. | 257/737 |
| 2012/0193785 A1* | 8/2012 | Lin et al. | 257/737 |
| 2012/0211881 A9* | 8/2012 | Lin et al. | 257/737 |
| 2013/0043583 A1* | 2/2013 | Wu et al. | 257/737 |

* cited by examiner

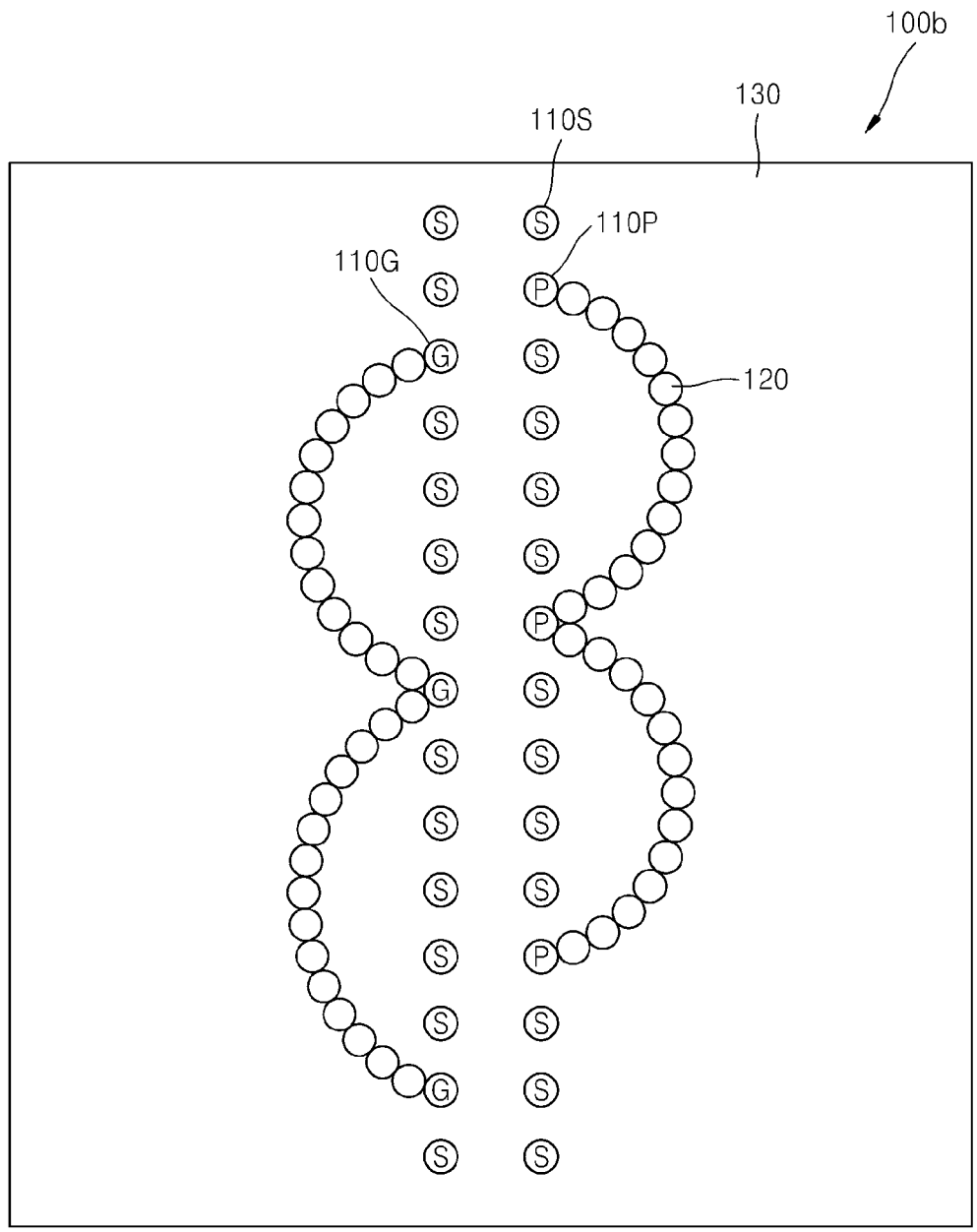

SEMICONDUCTOR CHIP, AND SEMICONDUCTOR PACKAGE AND SYSTEM EACH INCLUDING THE SEMICONDUCTOR CHIP

CROSS-REFERENCE TO RELATED APPLICATIONS

This application claims priority under 35 U.S.C. §119 from Korean Patent Application No. 10-2010-0044498, filed on May 12, 2010, in the Korean Intellectual Property Office, the disclosure of which is incorporated herein in its entirety by reference.

BACKGROUND

1. Field of the General Inventive Concept

The general inventive concept relates to a semiconductor chip and a semiconductor package including the same. More particularly, the general inventive concept relates to a semiconductor chip in which redistribution interconnects are implemented by shorting pseudo bumps arranged on a passivation film, and a semiconductor package and a system each including the semiconductor chip.

2. Description of the Related Art

Flip-chip bonding is widely used since it ensures that chips have a low resistance and a low inductance and provides excellent power and ground characteristics, as compared to wire bonding. Furthermore, flip-chip bonding enables designing of a pad layout with a high degree of freedom, and integration of a large number of terminals per a given area. Thus, flip-chips are used to fabricate high-speed semiconductor devices. In addition, redistribution interconnects are used in order to further enhance power/ground characteristics of flip-chips. However, general redistribution processes involve additional photolithography and plating processes, and thus increase processing time and costs.

SUMMARY OF THE INVENTION

The general inventive concept provides a semiconductor chip including redistribution interconnect configurations including semiconductor packages and systems each including the semiconductor chip.

The general inventive concept also provides a semiconductor package and a system each including the semiconductor chip including a redistribution interconnect that may be implemented.

Additional features and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a semiconductor chip including a semiconductor substrate, a passivation film disposed on the semiconductor substrate, and a plurality of pseudo bumps disposed on the passivation film, wherein the plurality of pseudo bumps are directly connected to each other to form at least one redistribution interconnect.

The plurality of pseudo bumps may each include a first under bump metallurgy (UBM) layer disposed on the passivation film, and a first solder layer disposed on the first UBM layer, and a plurality of first UBM layers have intervals therebetween, such that first solder layers are disposed to cover the plurality of first UBM layers and the intervals therebetween to directly connect adjacent first solder layers.

The plurality of pseudo bumps may each further include a conductive pillar disposed between the first UBM layer and the first solder layer.

The conductive pillar may have a convex upper surface having a larger height in a middle region than in edge regions thereof, so that the overlaying first solder layers may be connected directly to adjacent first solder layers when reflowed.

A height of the first solder layers may be greatest at the first UBM layers and smallest at the gaps between the first UBM layers. Thus, a molding member may also be injected between the semiconductor chip and a circuit board during the molding of a semiconductor package.

The semiconductor chip may further include an interconnect disposed in the semiconductor substrate, at least one pad electrically connected to the interconnect and exposed through at least one opening of the passivation film, and at least one through-bump disposed to be electrically connected to the pad through the at least one opening of the passivation film, wherein the at least one through-bump is directly connected to at least one of the pseudo bumps for redistribution interconnection. The at least one through-bump may each include a second UBM layer disposed on the at least one pad, and a second solder layer disposed on the second UBM layer. The second UBM layer may be disposed separated from the plurality of first UBM layers, and may be directly connected to at least one of the plurality of first UBM layers.

A height and width of the second solder layer may be larger than those of the plurality of first solder layers. This may allow the pseudo bumps to be separated from a circuit board of a semiconductor package when being flip-chip-bonded to the circuit board.

A width of the second UBM layer may be larger than that of the plurality of first UBM layers. An interval between the second UBM layer and one of the first UBM layers adjacent to the second UBM layer may be smaller than the interval between adjacent first UBM layers. Accordingly, the through-bump may be formed to be larger than the pseudo bumps without performing an additional process.

The at least one through-bump may include first and second through-bumps to which an equal voltage is applied, and the first and second through-bumps may be electrically connected, for example, in parallel, via a redistribution interconnect formed by the plurality of pseudo bumps. A ground voltage or a power voltage may be applied to the interconnect via the first and second through-bumps, thus improving power/ground characteristics.

The semiconductor chip may further include at least one connection bump disposed on the passivation film and directly connected to at least one of the pseudo bumps. The at least one connection bump may be electrically connected to the at least one through-bump via a redistribution interconnect formed by the plurality of pseudo bumps. The at least one connection bump may include a third UBM layer disposed on the passivation film, and a third solder layer disposed on the third UBM layer. The third UBM layer may be disposed separated from the first UBM layer, and the third solder layer may be directly connected to at least one of the first solder layers. Thus, the degree of freedom in layout of the circuit board may become high.

A semiconductor package may include the semiconductor chip described above, and a circuit board to which the semiconductor chip is flip-chip-bonded.

A system may include the semiconductor package.

The foregoing and/or other aspects and utilities of the present general inventive concept may also be achieved by preparing a semiconductor substrate having at least one pad on an upper surface thereof, forming a passivation film on the upper surface of the semiconductor substrate 102 so as to expose the at least one pad, forming a UBM layer on the passivation film and the exposed pad, forming a photoresist pattern exposing regions of the UBM layer, forming solder layers on the exposed regions of the UBM layer through openings of the photoresist pattern, removing the photoresist pattern and etching the exposed UBM layer using the solder layers as etch masks, and reflowing the solder layers in such a manner that adjacent solder layers are directly connected to one another, resulting in a redistribution interconnect.

The foregoing and/or other aspects and utilities of the present general inventive concept may also be achieved by providing a semiconductor package including a semiconductor substrate, a plurality of first power bumps disposed on one side of the semiconductor substrate, the first power bumps electrically connected by a first plurality of pseudo bumps, a plurality of second power bumps different than the first power bumps disposed on another side of the semiconductor substrate, the second power bumps electrically connected by a second plurality of pseudo bumps, and the first plurality of pseudo bumps may form a shape on the semiconductor substrate and the second plurality of pseudo bumps may form an inverse of the shape on the semiconductor substrate.

The plurality of first power bumps and second power bumps may be disposed in two respective columns in a center region of the semiconductor substrate and disposed in edge portions of the semiconductor substrate separate from the center region.

The foregoing and/or other aspects and utilities of the present general inventive concept may also be achieved by providing system including a semiconductor chip including a control unit to execute instructions for the system, an input/output unit to receive external data or signals and output data or signals from the system, a memory unit to store instructions to be executed in the control unit; an interface unit to receive and output data while communicating with a network; and a bus to connect the control unit, the input/output unit, the memory unit, and the interface unit, and at least one of the control unit, memory unit or interface unit may include a semiconductor chip including a semiconductor substrate, a plurality of conductive pads formed within the semiconductor substrate, a passivation film disposed on the semiconductor substrate to cover the conductive pads, a plurality of through bumps disposed on the semiconductor substrate to penetrate the passivation film and establish electrical connection with the plurality of conductive pads, and a plurality of pseudo bumps disposed on the semiconductor substrate atop the passivation film and establishing electrical connection with the conductive pads via the through bumps.

BRIEF DESCRIPTION OF THE DRAWINGS

These and other features and utilities of the general inventive concept will become apparent and more readily appreciated from the following description of the embodiments, taken in conjunction with the accompanying drawings in which:

FIG. 3 is a schematic plan view illustrating a semiconductor chip according to another embodiment of the general inventive concept;

DETAILED DESCRIPTION OF THE PREFERRED EMBODIMENTS

Figure 1:
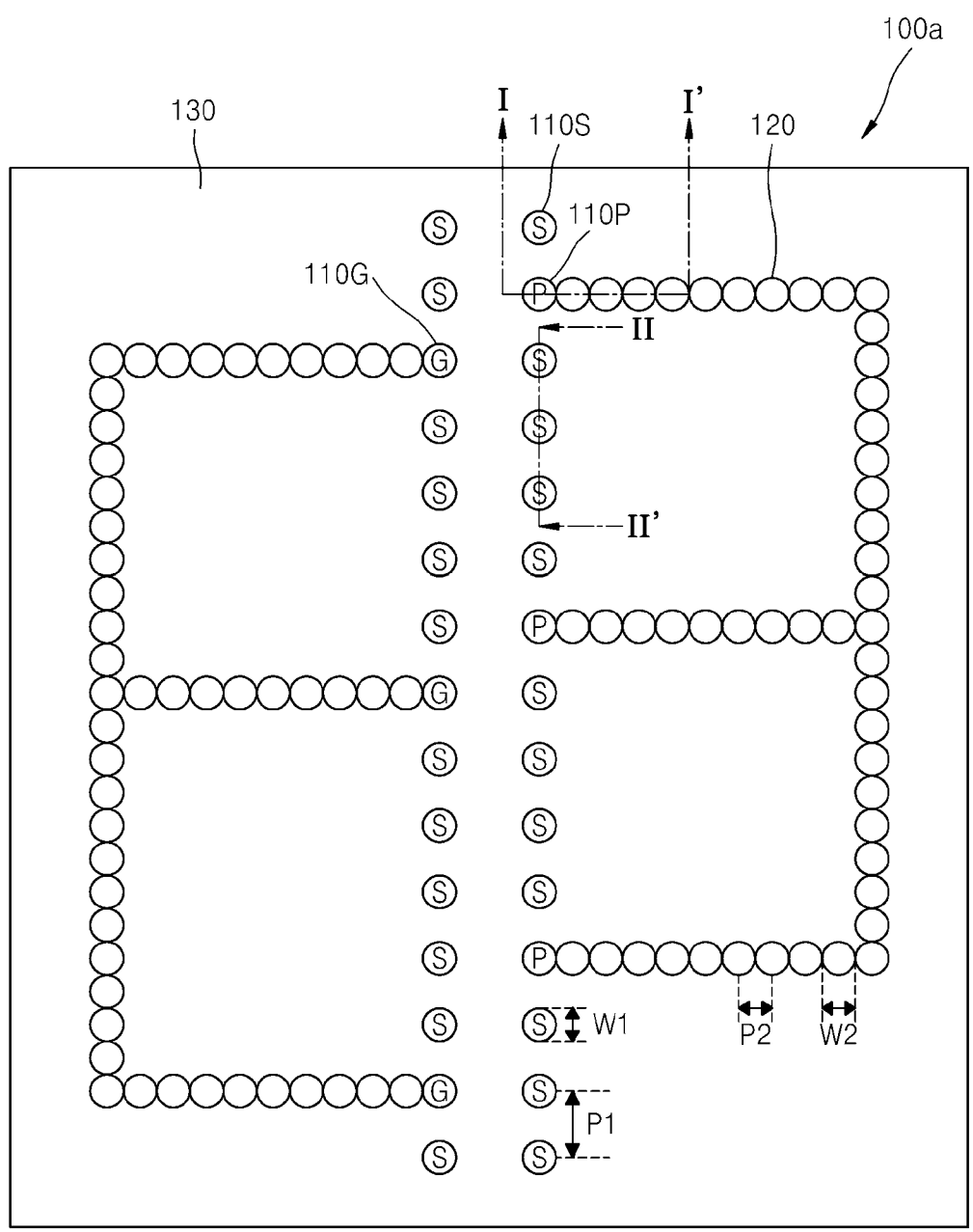
FIG. 1 is a schematic plan view illustrating a semiconductor chip according to an embodiment of the general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

This general inventive concept may, however, be embodied in many different forms and should not be construed as limited to the exemplary embodiments set forth herein. Rather, these embodiments are provided so that this disclosure will be thorough and complete, and will fully convey the scope of the general inventive concept to those skilled in the art.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. In the drawings, lengths and sizes of layers and regions may be exaggerated for clarity. Like reference numerals refer to like elements throughout. As used herein, the term "and/or" includes any and all combinations of one or more of the associated listed items.

The terms used herein are for the purpose of describing particular embodiments only and is not intended to be limiting of the general inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms.

These terms are only used to distinguish one element, component, region, layer or section from another region, layer or section. Thus, a first element, component, region, layer or section discussed below could be termed a second element, component, region, layer or section without departing from the teachings of the present general inventive concept.

Embodiments of the general inventive concept are described herein with reference to schematic illustrations of idealized embodiments (and intermediate structures) of the general inventive concept. As such, variations from the shapes of the illustrations as a result, for example, of manufacturing techniques and/or tolerances, are to be expected. Thus, embodiments of the general inventive concept should not be construed as limited to the particular shapes of regions illustrated herein but are to include deviations in shapes that result, for example, from manufacturing.

Figure 2A:
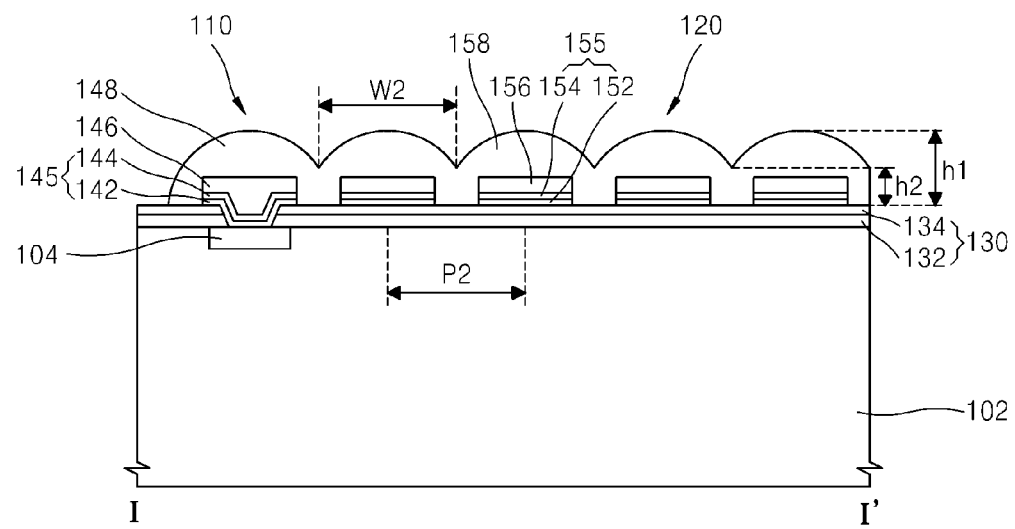
FIG. 2A is a schematic cross-sectional view illustrating the semiconductor chip of FIG. 1 taken along a line I-I' of FIG. 1.
Figure 2B:
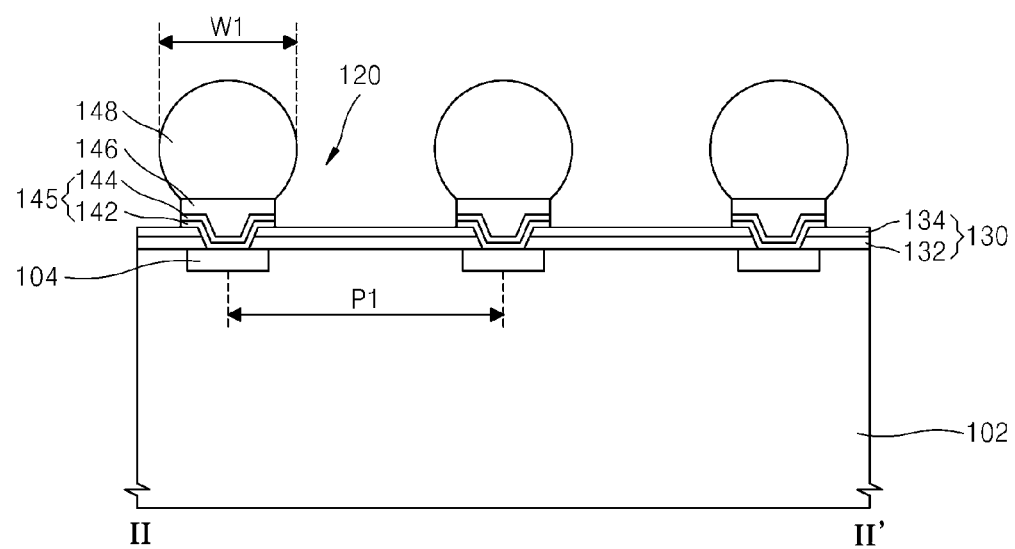
FIG. 2B is a schematic cross-sectional view illustrating the semiconductor chip of FIG. 1 taken along a line II-II' of FIG. 1.

FIG. 1 is a schematic plan view illustrating a semiconductor chip 100a according to an embodiment of the general inventive concept. FIG. 2A is a schematic cross-sectional view illustrating the semiconductor chip 100a taken along a line I-I'. FIG. 2B is a schematic cross-sectional view illustrating the semiconductor chip 100a taken along a line II-II'.

Referring to FIGS. 1, 2A, and 2B, the semiconductor chip 100a includes a semiconductor substrate 102, a passivation film 130, and pseudo bumps 120.

For example, the semiconductor substrate 102 may be a substrate including a semiconductor, such as silicon, silicon-germanium, or the like, an epitaxial layer, a Silicon On Insulator (SOI) layer, or a Semiconductor On Insulator (SeOI) layer. The semiconductor substrate 102 may include an integrated circuit (not illustrated) having at least one function selected from among a memory function, a logic function, a control function, and a processor function, according to the usage of the semiconductor chip 100a. The semiconductor substrate 102 may include an interconnect (not illustrated) that receives a signal from and outputs a signal to the integrated circuit and connects internal elements of the integrated circuit. The interconnect may be electrically connected to an external device or apparatus, or a printed circuit board (PCB) via a pad 104 disposed on an upper surface of the semiconductor substrate 102. Though the integrated circuit and the interconnect are not illustrated to avoid obscuring the scope of the present general inventive concept, such constructions will be obvious to one of ordinary skill in the art.

The passivation film 130 may be disposed on the upper surface of the semiconductor substrate 102 to protect the integrated circuit of the semiconductor substrate 102 from an impact or external factors, such as moisture, and to insulate the integrated circuit from external environment. The passivation film 130 may include a rigid material, such as a nitride film. A detailed description of the passivation film 130 will be provided later.

The pseudo bumps 120 are disposed on the passivation film 130. Each pseudo bump 120 is directly connected to adjacent pseudo bumps 120 to form at least one redistribution interconnect. The pseudo bumps 120 may include a material that is meltable in a reflow process, for example, a solder. Thus, the pseudo bumps 120, which are initially separated from one another, may melt in a reflow process, and thus be directly connected together. A detailed description of the pseudo bumps 120 will be provided later.

Pseudo bumps 120 are connected to each other above or external from the surface of the semiconductor substrate, and thus do not come into direct physical contact with any electrical layers or integrated circuitry formed within the substrate 102. The pseudo bumps may be dummy bumps that may be connected to power or ground bumps to distribute power connections to various areas of a semiconductor package and to help level out the physical structure of a semiconductor device package.

The semiconductor chip 100a may further include through-bumps 110. The through-bumps 110 are disposed in such a way as to be connected to the pad 104 of the semiconductor substrate 102 via an opening of the passivation film 130. The through-bumps 110, which are disposed on the pad 104, may function as an input/output terminal to input an external signal to the integrated circuit of the semiconductor substrate 102 and to output a signal from the integrated circuit. Referring to FIG. 1, the through-bumps 110 may be defined as signal bumps 110S when a signal is to be input or output therethrough, and as power bumps 110P and ground bumps 110G when power and ground voltages are to be applied thereto.

Referring to FIG. 1, the through-bumps 110 are arranged at an interval P1. Although the through-bumps 110 in FIG. 1 are arranged in two columns in a center region of the semiconductor chip 110a, aspects of the general inventive concept are not limited thereto. For example, the through-bumps 110 may be arranged near edges of the semiconductor chip 110a or may be uniformly distributed across the entire surface of the semiconductor chip 110a. Aspects of the general inventive concept are not limited to the arrangement of the through-bumps 110 illustrated in FIG. 1. The signal bumps 110S are not electrically connected to one another.

As illustrated in FIG. 1, the power bumps 110P may be electrically connected to one another via the pseudo bumps 120, which are electrically connected to one another on the passivation film 130. The ground bumps 110G may be electrically connected to one another via the pseudo bumps 120, which are electrically connected to one another on the passivation film 130. The pseudo bumps 120 are arranged at an interval P2. The pseudo bumps 120 may be connected to one another to form the two redistribution interconnects illustrated in FIG. 1 that connect to the ground bumps 110G and power bumps 110P, respectively. The power bumps 110P and the ground bumps 110G may be connected via the two redistribution interconnects formed by the pseudo bumps 120 to form a power grid and a ground grid. The power and ground grids may allow the resistance and inductance between an external device or apparatus and the power and ground bumps 110P and 110G to be reduced, thereby improving driving power characteristics. Though the current embodiment illustrates three power bumps 110P and three ground bumps 110G, the numbers of power bumps 100P and ground bumps 110G and the illustrated grids are not limited thereto. The numbers of power bumps 100P and ground bumps 110G may be appropriately varied. Though the current embodiment illustrates that the power bumps 110P or ground bumps 110G are connected via one redistribution interconnect, in order to further reduce the resistance and the inductance between the power bumps 110P or ground bumps 110G, a plurality of redistribution interconnects may be further used to connect the power bumps 110P or ground bumps 110G in parallel.

In the current embodiment, the through-bumps 110 may have a width W1, and the pseudo bumps may have a width W2. The width W1 and the width W2 may be the same, as illustrated in FIG. 1. However, the widths W1 and W2 may differ. The interval P1 between the through-bumps 110 may be larger than the interval P2 between the pseudo bumps 120. The interval P1 may also be larger than an interval between the pseudo bumps 120 connected to the through-bumps 110. Thus, the through-bumps 110 may be separated from one another, and the pseudo bumps 120 may be connected to one another and to the through-bumps 110.

Referring to FIG. 2A, the pad 104, which may be connected to an interconnect, is disposed below the upper surface in an upper region of the semiconductor substrate 102 in which the integrated circuit and the interconnect may be disposed. Although the pad 104 in FIG. 1 is recessed from the upper surface of the semiconductor substrate 102, aspects of the general inventive concept are not limited thereto. For example, the pad 104 may be disposed on or above the upper surface of the semiconductor substrate 102. The pad 104 may also be formed partially recessed, and partially above the surface of the semiconductor substrate 102.

A first passivation film 132 may be disposed on the upper surface of the semiconductor substrate 102. The first passivation film 132 may include an insulating film to protect the integrated circuit and the interconnect in the semiconductor substrate 102 from external factors. For example, the insulating film may include at least one material selected from the group consisting of silicon oxide, silicon nitride, and silicon oxynitride. For example, the first passivation film 132 may be formed of a silicon nitride film. Optionally, a second passivation film 134 may be disposed on the first passivation film 132. The second passivation film 134 may be an insulating film to enhance interfacial characteristics with respect to the overlaying pseudo bumps 120. For example, when the first passivation film 132 is a silicon nitride film, the second passivation film 134 may be a silicon oxide film. The first passivation film 132 and the second passivation film 134 may collectively be referred to as the passivation film 130. The passivation film 130 may be formed as a double layer, as illustrated in FIG. 2A. Alternatively, the passivation film 130 may be formed as a single layer or a multi-layer including at least three layers. The passivation film 130 may have an opening exposing a region of the pad 104, for example, a center region of the pad 104 such that the through-bumps 110 are electrically connected to the pad 104 through the opening of the passivation film 130.

A second under bump metallurgy (UBM) layer 145 may be formed on the pad 104. The second UBM layer 145 may be disposed to partially cover the passivation film 130 and the region of the pad 104 exposed by the passivation film 130, as illustrated in FIG. 2A. The second UBM layer 145 may include a second barrier layer 142 and a second seed layer 144. As used herein, the second barrier layer 142 and the second seed layer 144 may be collectively referred to as the second UBM layer 145. The second barrier layer 142 may include, for example, Ti/TiN. The second barrier layer 142 may prevent a conductive material of the through-bumps 110 from diffusing into the passivation film 130 and/or the semiconductor substrate 102. The second seed layer 144 may be formed of the same material as that used to form a material layer on the second seed 144. For example, the second seed layer 144 may be formed of copper. The second seed layer 144 may be used to form a second conductive pillar 146 on the second seed layer 144. Although formed as a double layer in FIG. 2A, the second UBM layer 145 may be formed as a single layer or a multi-layer including at least three layers.

Optionally, the second conductive pillar 146 may be disposed on the second UBM layer 145. The second conductive pillar 146 may be formed of a high-conductivity material, for example, copper. The second conductive pillar 146 may increase the height of the through-bumps 110, ensuring reliable connection between the pad 104 and an external device or apparatus. The second conductive pillar 146 may provide a base for a second solder layer 148 disposed thereon to flow down therefrom along sidewalls of the second conductive pillar 146 during a reflow process.

The second solder layer 148 may be disposed on the second UBM layer 145 or the second conductive pillar 146. The second solder layer 148 may be formed by curing a solder material that melted down during the reflow process. This will be described below in more detail. Thus, the second solder layer 148 may be formed of a reflowable material, for example, a lead (Pb)-containing solder, tin (Sn), or a lead-free solder alloyed with at least one of silver (Ag) and copper (Cu). When the semiconductor chip 100a is bonded to a circuit board by using flip-chip bonding, the second solder layer 148 may function as a terminal, for example, a solder ball, interconnecting the semiconductor chip 110a and the circuit board.

First UBM layers 155 may be disposed at an interval on the passivation film 130. The first UBM layers 155 may be arranged at such an interval that adjacent first solder layers 158 can be directly interconnected after being reflowed, as illustrated in FIG. 2A. Similar to the second UBM layer 145, the first UBM layers 155 may each include a first barrier layer 152 and a first seed layer 154. The first barrier layer 152 may strongly bind the pseudo bumps 120 to the passivation film 130. The first barrier layer 152 may be formed of the same material as that of the second barrier layer 142. The first barrier layer 152 may be formed simultaneously with the second barrier layer 142 in the same process. The first seed layer 154 may be formed of the same material as that of the second seed layer 144. The first seed layer 154 may be formed simultaneously with the second seed layer 145 in the same process.

Similar to the second conductive pillar 146, the first conductive pillar 156 may be formed of a high-conductivity material, for example, copper, on the first UBM layer 155. The first conductive pillar 156 may be formed simultaneously with the second conductive pillar 146 in the same process. The first solder layers 158 may be disposed on the first conductive pillars 156. The first solder layers 158 may also be formed of the same material as that of the second solder layer 148. The first solder layers 158 may be formed simultaneously with the second solder layer 148 in the same process.

The first solder layers 158 may melt to flow in a reflow process. A solder material may become spherical, if used in an appropriate amount, due to surface tension when melted. However, if the amount of the solder material is increased, the solder material may not retain a spherical form and thus may flow down. As such, if the amount of the solder material used is too large to retain a spherical form on the first conductive pillars 156, which are separated at an interval, the first solder layers 158 may flow down over the gaps between adjacent first conductive pillars 156, and thus the first solder layers 158 may be connected to one another and to the second solder layer 148. However, the second and first solder layers 148 and 158 have a cohesiveness even when melted. Thus, a height h1 of the second and first solders layers 148 and 158 on the respective second and first UBM layers 145 and 155 may be greater than a height h2 of the second and first solders layers 148 and 158 in the gaps between the second and first UBM layers 145 and 155. Thus, the second and first solder layers 148 and 158 may have an uneven upper surface. Due to the uneven surface structures of the second and first solder layer 148 and 158, a molded underfill (MUF) process may be performed to fill a gap between the semiconductor chip 100a and the circuit board with a molding material. This will be described below in more detail. The flowability and viscosity of the second and first solder layers 148 and 158 may vary according to the temperature at which the reflow process is performed. Thus, the temperature of the reflow process may be varied to obtain the through-bumps 110 and the pseudo bumps 120 having a desired cross-sectional profile. For example, by increasing the temperature at which the reflow process is performed, the flowability of the second and first solder layers 148 and 158 may be increased.

Referring to FIG. 2B, only the through-bumps 110 and not the pseudo bumps 120 are illustrated on the substrate 102. As described above, the through-bumps 110 are disposed at an interval P1 and are electrically insulated from one another. As illustrated in FIG. 1, the semiconductor chip 100a may be designed in such a way that the interval P1 between the through-bumps 110 is greater than the interval between the through-bumps 110 and the pseudo bumps 120, and greater than the interval P2 between the pseudo bumps 120. Although the second solder layers 148 in FIG. 2B are respectively disposed on the second conductive pillars 146, aspects of the general inventive concept are not limited thereto. For example, the second solder layers 148 may flow down along the sidewalls of the second conductive pillars 146, as illustrated in FIG. 2A, to contact the passivation film 130. However, the interval P1 between the through bumps 110 is large enough such as for the adjacent second solder layers 148 to be separated from one another.

FIG. 3 is a schematic plan view illustrating a semiconductor chip 100b according to another embodiment of the general inventive concept.

The semiconductor chip 100b of FIG. 3 is substantially the same as the semiconductor chip 100a of FIG. 1, except for a path of the redistribution interconnect formed by the pseudo bumps 120. A detailed description of substantially the same parts as those described above will not be provided here.

The redistribution interconnect formed by the pseudo bumps 120 in the embodiment of FIG. 1 constitutes a linear path. However, in the current embodiment, the pseudo bumps 120 form a redistribution interconnect whose path is curved at an angle in several arc-shapes, as illustrated in FIG. 3. Since the redistribution interconnection is formed by the pseudo bumps 120, a higher degree of freedom is ensured in designing the semiconductor chip 100b and connection schemes for ground and power connections. Though not illustrated, the pseudo bumps 120 may be further added to form redistribution interconnects connected in parallel.

The redistribution interconnects formed by the pseudo bumps 120 may form paths having several different shapes. As illustrated in FIG. 1, the ground bumps 110G and power bumps 110p may be arranged at intervals, and do not physically connect to each other. That is, each of the grounds bumps 110G do not directly physically connect to other ground bumps 110G and each of the power bumps 110P do not directly physically connect to other power bumps 110P. However, ground bumps 110G may be connected together by different arrangements of pseudo bumps 120 that form redistribution interconnects of various shapes. The pseudo bumps 120 that connect power bumps 110P also may be formed in various shapes.

Figure 4:
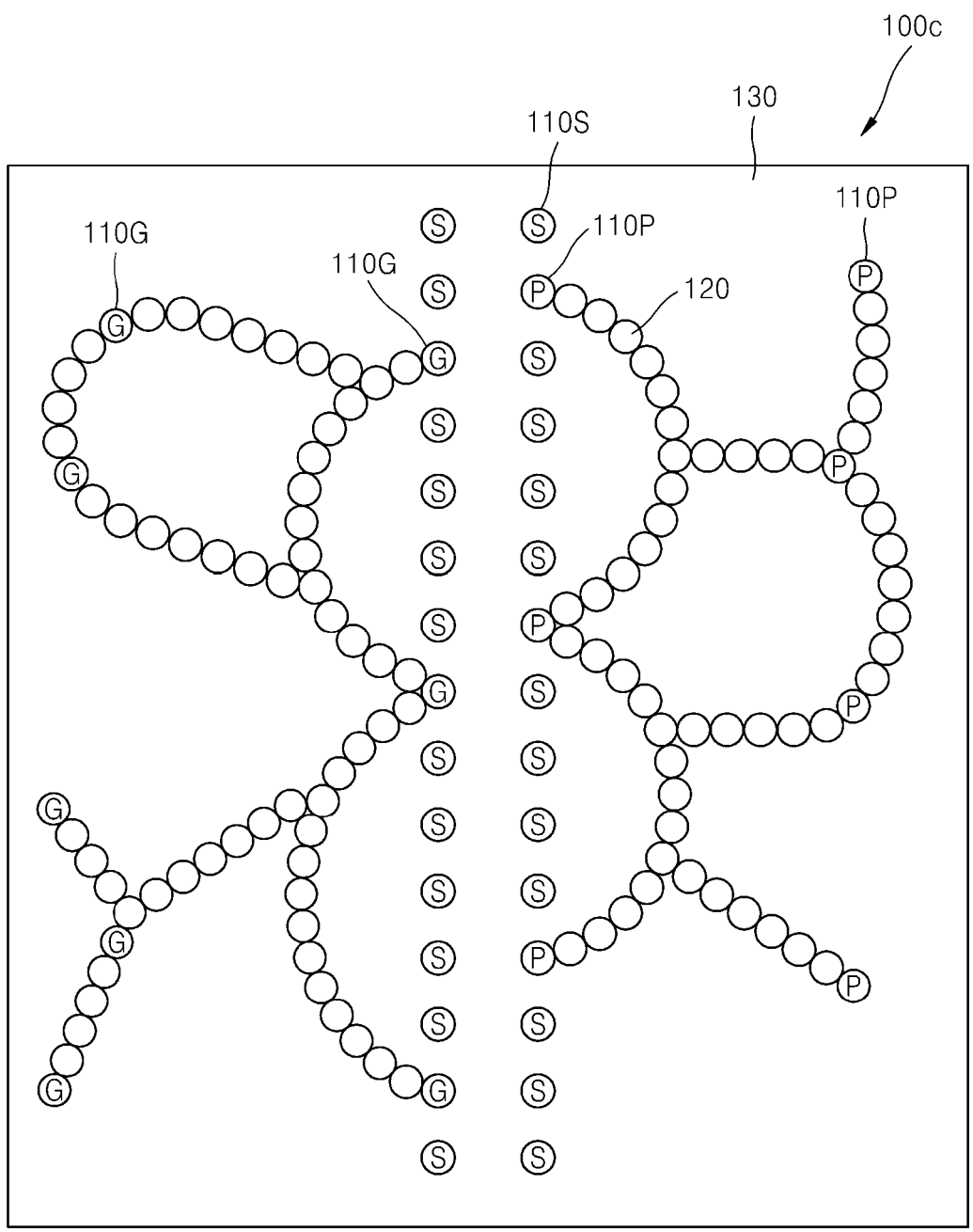
FIG. 4 is a schematic plan view illustrating a semiconductor chip according to another embodiment of the general inventive concept.

As illustrated in FIG. 1, the plurality of pseudo bumps 120 that connect a plurality of ground bumps 110G may for a capital letter "E" shape. Relatedly, the pseudo bumps 120 that connect a plurality of power bumps 110P also form an "E" shape, but in an inverse or mirror arrangement to the pseudo bumps 120 of the ground connection. This inverse, or mirror, arrangement of bumps is also illustrated in the arc-shapes of FIG. 3. In FIG. 3, although the number of bumps are not illustrated to be the exact same on both sides of center columns regions, combinations of pseudo bumps 120 and ground bumps 110G may be configured to be exact mirror images, inversions, or symmetrical, in terms of shape and number of pseudo bumps 120 and power bumps 110P on the other side of the substrate 100b. Also, as illustrated in FIG. 4, the bump schemes may have portions that are inverse, mirror, or symmetrical, and portions that are not. The inverted portions may also be shifted along a center region of the substrates 100a, 100b and 100c.

FIG. 4 is a schematic plan view illustrating a semiconductor chip 100c according to another embodiment of the general inventive concept.

The semiconductor chip 100c of FIG. 4 is substantially the same as the semiconductor chip 100a of FIG. 1, except for a path of the redistribution interconnect formed by the pseudo bumps 120 and that the through-bumps 110 are disposed in a center and edge portions of the semiconductor chip 110c. A detailed description of substantially the same parts as those described above will not be provided here.

As illustrated in FIG. 4, the power bumps 110P may be connected together through the redistribution interconnects formed by the pseudo bumps 120, regardless of the positions of the power bumps 110P. Likewise, the ground bumps 110G may be connected together through the redistribution interconnects formed by the pseudo bumps 120, regardless of the positions of the ground bumps 110G. As illustrated in FIG. 4, the pseudo bumps 120 may be connected in such a manner as to form redistribution interconnects connected in parallel, thereby further reducing the electrical resistance and inductance between the power and ground bumps 110P and 110G and an external device or apparatus.

As illustrated in FIGS. 1, 3 and 4, power bumps 110P are arranged on one side of the semiconductor substrate 100, and ground bumps 110G are arranged on the other. Configuring the bumps in this manner may be useful in isolating power and ground connections to aid in circuit design. However, the present general inventive concept is not limited to such isolated configurations. Power and ground connections may also be positioned on same sides of a semiconductor substrate, to allow greater flexibility and design of integrated circuit connection schemes.

Figure 5:
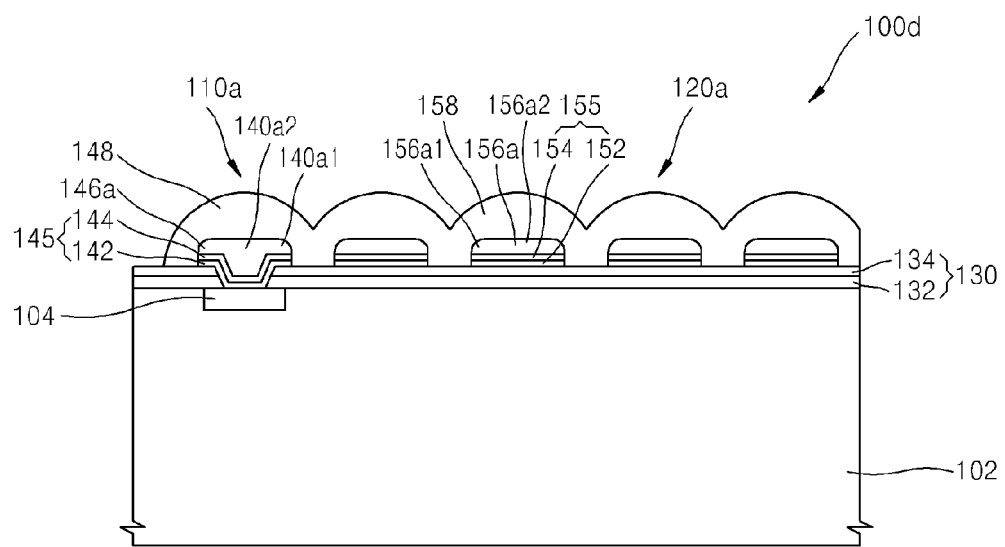
FIG. 5 is a schematic cross-sectional view illustrating a semiconductor chip according to another embodiment of the general inventive concept.

FIG. 5 is a schematic cross-sectional view illustrating a semiconductor chip 100d according to another embodiment of the general inventive concept.

The semiconductor chip 100d of FIG. 5 is substantially the same as the semiconductor chip 100a of FIG. 2A, except that the surface shapes of second and first conductive pillars 146a and 156a are different from those of the second and first conductive pillars 146 and 156. A detailed description of substantially the same parts as those described above will not be provided here.

The second and first solder layers 148 and 158 are respectively disposed on the second and first conductive pillars 146a and 156a. Each of the second and first solder layers 148 and 158 are connected to adjacent second and first solder layers 148 and 158 by using a reflow process. In order to facilitate the flowing of a melt solder material down from the second and first conductive pillars 146 and 156a to the passivation film 130, the second and first conductive pillars 146a and 156a may have a height profile in which a height of edge regions 140a1 and 156a1 of the conductive pillars is smaller than that of a center regions 140a2 and 156a2 thereof. To this end, the second and first conductive pillars 146 and 156 of FIG. 2A having a flat surface may be isotropically etched. A detailed description in this regard will be provided later.

Figure 6:
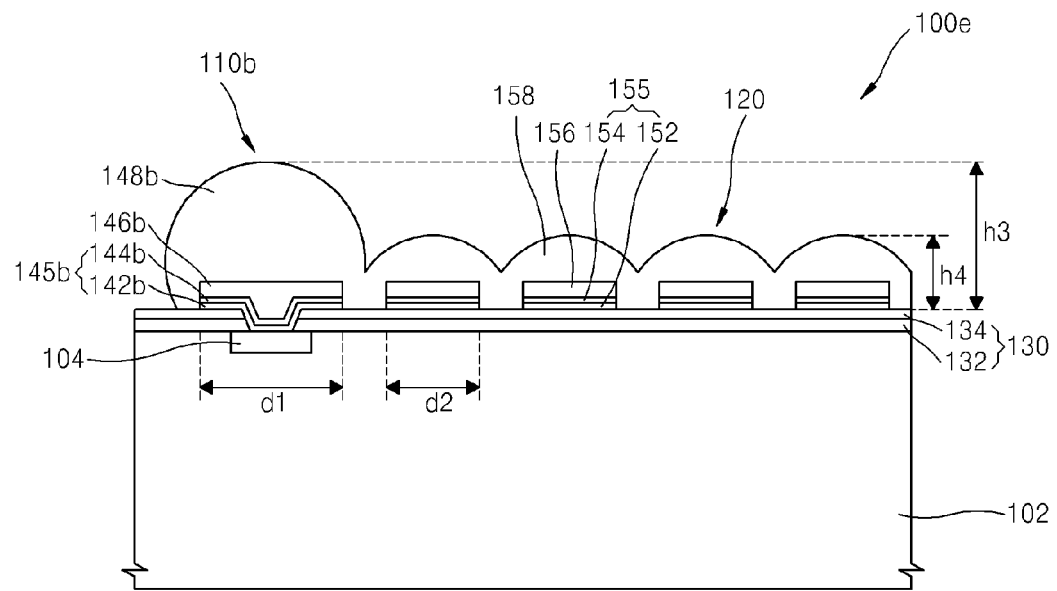
FIG. 6 is a schematic cross-sectional view illustrating a semiconductor chip according to another embodiment of the general inventive concept.

FIG. 6 is a schematic cross-sectional view illustrating a semiconductor chip 100e according to another embodiment of the general inventive concept.

The semiconductor chip 100e of FIG. 6 is substantially the same as the semiconductor chip 100a of FIG. 2A, except that through-bumps 110b have a size different from that of through-bumps 110. A detailed description of substantially the same parts as those described above will not be provided here.

As illustrated in FIG. 6, the through-bumps 110b may have a height h3 that is larger than the height h4 of the pseudo bumps 120. To this end, the semiconductor chip 100e may be designed in such a way that second UBM layers 145b and second conductive pillars 146b of the through-bumps 110b are larger than the first UBM layers 155 and the first conductive pillars 156 of the pseudo bumps 120. For example, a width d1 of the second UBM layers 145b and the second conductive pillar 146b may be larger than a width d2 of the first UBM layers 155 and the first conductive pillars 156. The larger the width d1 of the second UBM layers 145b and the second conductive pillars 146b allows a larger amount of a solder material to be applied thereon. Thus, through-bumps 110b that are larger, even after a reflow process, in height than the pseudo bumps 120 may be obtained. For example, a solder material may be applied to a height that is substantially the same as the width d1 of the second conductive pillars 146b.

When the semiconductor chip 100e is connected to a circuit board via the through-bumps 110b, the pseudo bumps 120 may not contact the circuit board, since the pseudo bumps 120 are smaller than the through-bumps 110b. Thus, electrical shorts and current leakage may be prevented. In addition, in a packaging process, a molding material may be injected also into the gap between the pseudo bumps 120 and the circuit board, ensuring secure molding.

Figure 7:
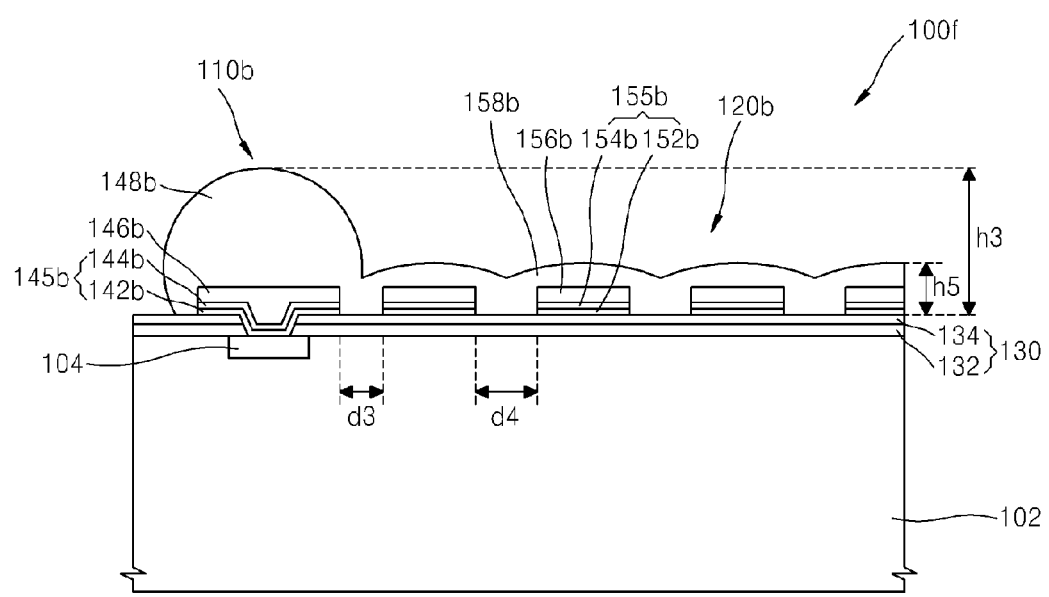
FIG. 7 is a schematic cross-sectional view illustrating a semiconductor chip according to another embodiment of the general inventive concept.

FIG. 7 is a schematic cross-sectional view illustrating a semiconductor chip 100f according to another embodiment of the general inventive concept.

The semiconductor chip 100f of FIG. 7 is substantially the same as the semiconductor chip 100e of FIG. 6, except that an interval d4 between the pseudo bumps 120 is larger than an interval between the pseudo bumps 120 of FIG. 6. A detailed description of substantially the same parts as those described above will not be provided here.

As illustrated in FIG. 7, the interval d4 between the pseudo bumps 120 may be larger than the interval d3 between the through-bumps 110b and the pseudo bumps 120. However, the pseudo bumps 120 should be connected to one another, even though the interval d4 between the pseudo bumps 120 is larger than the interval d3. To this end, a solder material to form second solder layers 158b on the pseudo bumps 120 may be melted. The higher the temperature, the more flowable the solder material. The solder material to form the second solder layers 158b should be sufficiently flowable as to fill the interval d4 between the pseudo bumps 120. As a result, the pseudo bumps 120 may have a height h5 that is smaller than the height h4 of the pseudo bumps 120 of FIG. 6. Thus, the pseudo bumps 120 may be further spaced from the circuit board, as compared to the configuration of FIG. 6, securing improved insulation of the circuit board.

Figure 8:
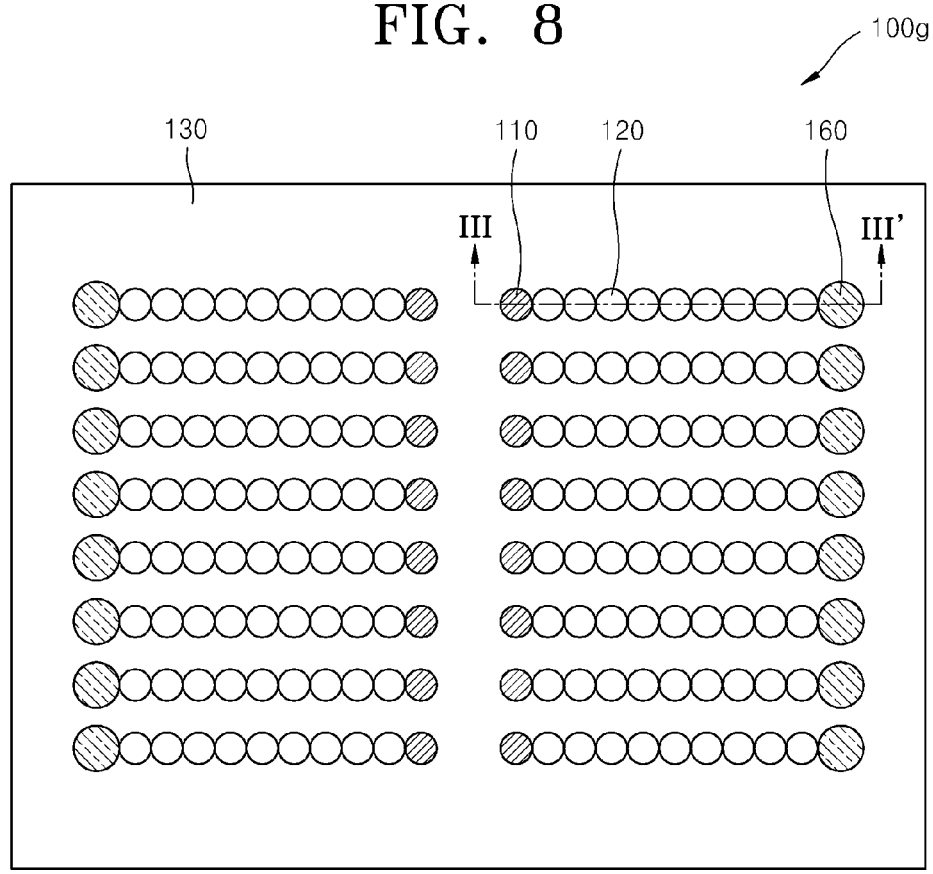
FIG. 8 is a schematic plan view illustrating a semiconductor chip according to another embodiment of the general inventive concept.
Figure 9:
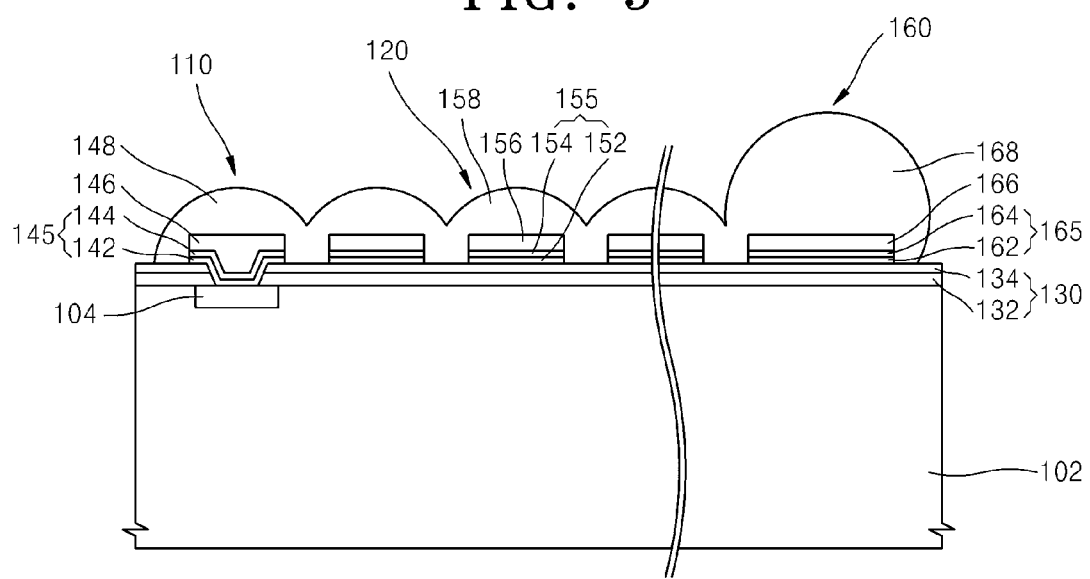
FIG. 9 is a schematic cross-sectional view illustrating the semiconductor chip of FIG. 8 taken along a line III-III' of FIG. 8.

FIG. 8 is a schematic plan view illustrating a semiconductor chip 100g according to another embodiment of the general inventive concept. FIG. 9 is a schematic cross-sectional view illustrating the semiconductor chip 100g taken along a line III-III' of FIG. 8.

Referring to FIGS. 8 and 9, the semiconductor chip 100g includes the through-bumps 110, the pseudo bumps 120 constituting a plurality of redistribution interconnects, and connection bumps 160.

Though the current embodiment illustrates that the through-bumps 110 are disposed in a center region of the semiconductor chip 100g, aspects of the general inventive concept are not limited thereto.

The connection bumps 160 can function as terminals to connect the semiconductor chip 100g to an external device or apparatus, or a circuit board. The connection bumps 160 may each include a third UBM layer 165, a third conductive pillar 166, and a third solder layer 168. The third UBM layer 165 may include a third barrier layer 162 and a third seed layer 164. The connection bumps 160 may have substantially the same structure as the pseudo bumps 120. Similar to the through-bumps 110b of FIGS. 6 and 7, the connection bumps 160, which include the third solder layers 168, may have a height that is larger than that of the pseudo bumps 120, which includes the first solder layers 158. To this end, the third UBM layer 165 may have a width that is larger than that of the first UBM layer 155. Though used for flip-chip bonding in the current embodiment, the connection bumps 160 may also function as pads for wire bonding.

The pseudo bumps 120 may function as redistribution interconnects to electrically connect the through-bumps 110 and connection bumps 160, respectively. Each pseudo bump 120 is directly connected to adjacent pseudo bumps 120 as in the embodiments described above. Thus, connection points to an external apparatus may be shifted from a center region to edge regions of the semiconductor chip 100g. In other words, a conductive path may be formed by connecting the pseudo bumps 120 to one another, thereby realizing a redistribution interconnect.

The embodiments illustrated in FIGS. 3 to 9 are provided for illustrative purposes, and are not intended to limit the scope of the general inventive concept. It should be noted that the embodiments of FIGS. 3 to 9 may constitute features of the present general inventive concept individually or in combination.

Figure 10:
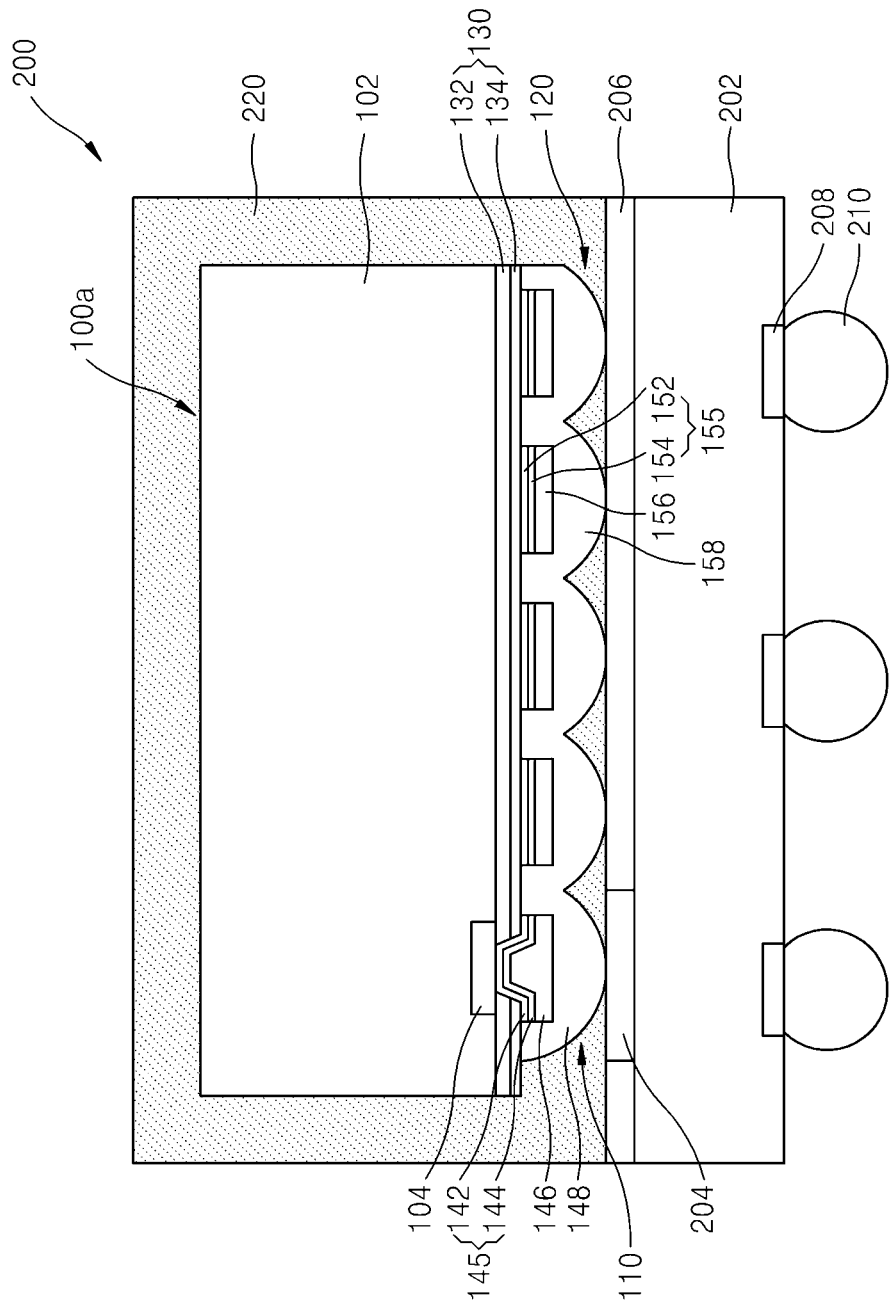
FIG. 10 is a schematic cross-sectional view illustrating a semiconductor package according to an embodiment of the general inventive concept.

FIG. 10 is a schematic cross-sectional view illustrating a semiconductor package 200 according to an embodiment of the general inventive concept.

Referring to FIG. 10, the semiconductor package 200 includes a circuit board 202, the semiconductor chip 100a flip-chip-bonded to the circuit board 202, and a molding member 220 encapsulating the semiconductor chip 100a.

The circuit board 202 may include a pad 204 connected to the semiconductor chip 100a, and an insulating film 206 covering the circuit board 202 and having an opening exposing the pad 204. The circuit board 202 may also include a pad 208 and a solder ball 210 on a surface opposite to the surface having the pad 204, wherein the pad 208 is a connection point to connect to an external apparatus, and the solder ball 210 is attached to the pad 208. The circuit board 202 may be, for example, a printed circuit board (PCB), or another semiconductor chip. The circuit board 202 of FIG. 10 is an example for illustrative purposes only. Thus, aspects of the general inventive concept are not limited to the shape and structure of the circuit board 202.

The molding member 220, which encapsulates the semiconductor chip 100a may also fix the semiconductor chip 100a to the circuit board 202. The molding member 220 may cover an upper surface and sides of semiconductor chip 100a and fill a space between the semiconductor chip 100a and circuit board 202 when a MUF process is used for molding.

As illustrated in FIG. 10, even when the pseudo bumps 120 and the through-bumps 110 have the same height, the semiconductor chip 100a and the circuit board 202 may be electrically insulated due to the insulating film 206 disposed on the circuit board 202. However, when the pseudo bumps 120 have a height different from that of the through-bumps 110 or the connection bump 160, as in the embodiments of FIGS. 6 to 9, the electrical insulation between the semiconductor chip 100a and the circuit board 202 may be more reliable.

Though the semiconductor chip 100a of FIG. 10 is bonded to the circuit board 202 by flip-chip bonding, for example, the semiconductor chip 100g of FIG. 8 may be bonded to the circuit board 202 by wire bonding.

Figure 11:
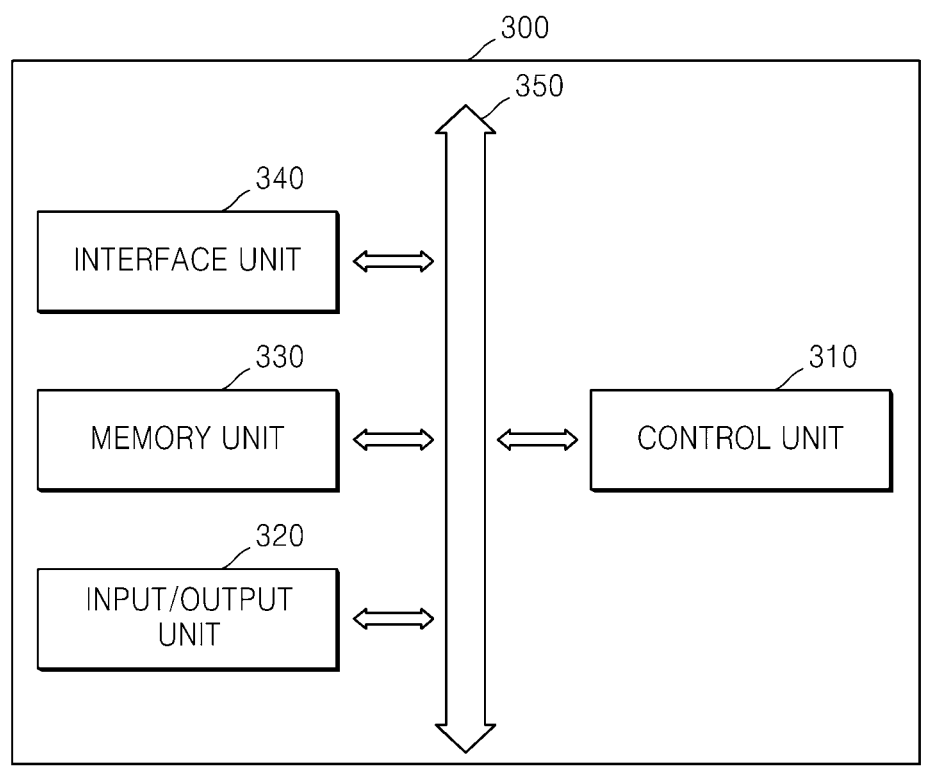
FIG. 11 is a schematic circuit diagram illustrating a system according to an embodiment of the general inventive concept.

FIG. 11 is a schematic circuit diagram illustrating a system 300 according to an embodiment of the general inventive concept.

Referring to FIG. 11, the system 300 may include a control unit 310, an input/output unit 320, a memory unit 330, an interface unit 340, and a bus 350. The control unit 310, the input/output unit 320, the memory unit 330, and the interface unit 340 are connected via the bus 350.

The control unit 310 may include at least one processor to execute instructions, for example, a microprocessor, a digital signal processor, or a microcontroller.

The input/output unit 320 may receive external data or signals and may output data or signals from the system 300. For example, the input/output unit 320 may include a keyboard, a keypad, or a display device. The memory unit 330 may store instructions to be executed in the control unit 310. The memory unit 330 may include any of various types of memory, for example, a DRAM, a flash memory, or the like. The interface unit 340 may receive and output data while communicating with a network.

In the system 300, at least one of the control unit 310, the memory unit 330, and the interface unit 340 may include any of the semiconductor chips 100a to 100g illustrated in FIGS. 1 to 10, for example, the semiconductor package 200 of FIG. 10. In other words, the semiconductor package 200 of FIG. 10 may be a memory or logic semiconductor package constituting the control unit 310, the memory unit 330, or the interface unit 340.

The system 300 may be a mobile system, for example, a PDA, a laptop computer, a web tablet, a wireless phone, a mobile phone, a digital music player, a memory card, or a data transmitter or receiver, or other electronic and computer devices known in the art to use semiconductor packages.

FIGS. 12A to 12F are cross-sectional views illustrating a method of fabricating a semiconductor chip according to an embodiment of the general inventive concept.

Figure 12A:
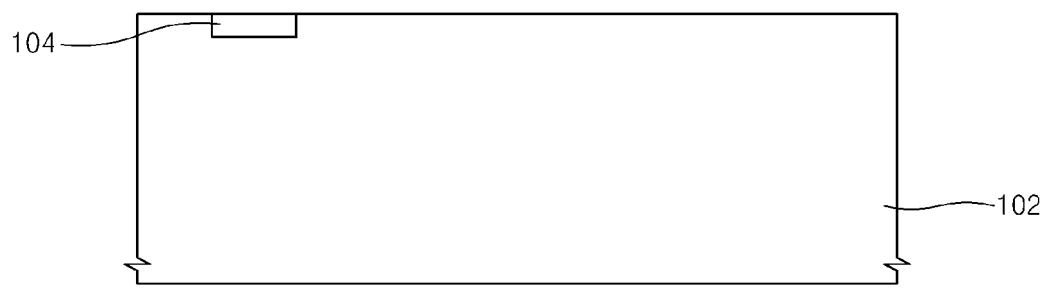
FIGS. 12A to 12F are cross-sectional views illustrating a method of fabricating a semiconductor chip according to an embodiment of the general inventive concept.

Referring to FIG. 12a, a semiconductor substrate 102 is prepared. As described above, the semiconductor substrate 102 may include an integrated circuit or an interconnect connected to the integrated circuit, according to the usage of the semiconductor chip. A pad 104 to be connected to the interconnect may be formed in the semiconductor substrate 102. The pad 104 may be formed recessed from an upper surface of the semiconductor substrate 102 or may be formed on the upper surface of the semiconductor substrate 102.

Figure 12B:
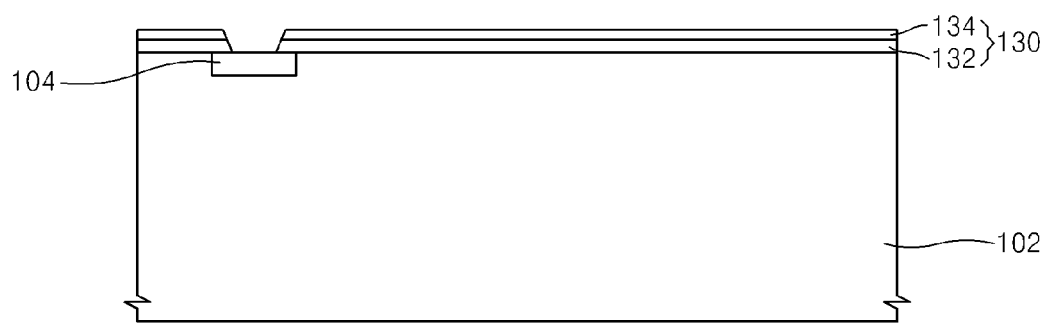

Referring to FIG. 12B, a passivation film 130 may be formed on the upper surface of the semiconductor substrate 102. As described above, the passivation film 130 may include a first passivation film 132 and a second passivation film 134. The first passivation film 132 may be formed of a nitride film, and the second passivation film 134 may be formed of an oxide layer. An opening may be formed in the passivation film 130 to expose the pad 104. The opening, which exposes at least a part of the pad 104, may be formed using photolithography and etching processes.

Figure 12C:
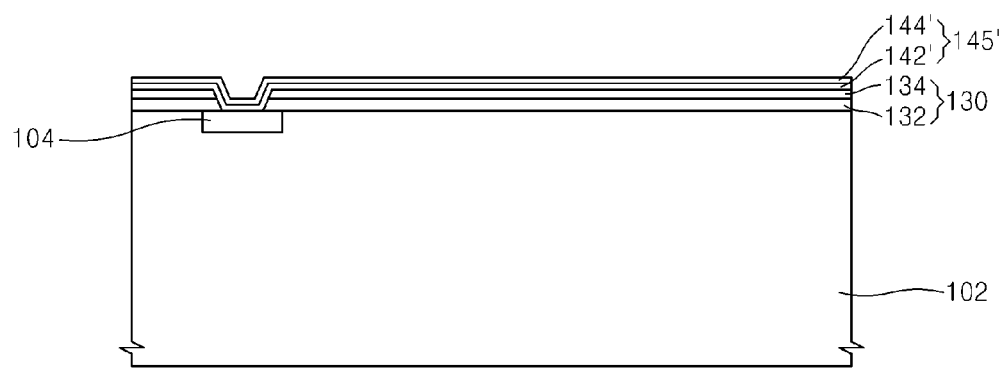

Referring to FIG. 12C, a UBM layer 145' may be formed on the passivation film 130 and the exposed pad 104. The UBM layer 145' may include a barrier layer 142' and a seed layer 144'. The barrier layer 142' and the seed layer 144' may be sequentially formed on the passivation film 130 by using any of various methods, for example, chemical vapor deposition (CVD), plasma-enhanced CVD (PECVD), high-density plasma CVD (HDP-CVD), digital CVD, pulsed CVD, atomic layer deposition (ALD), or sputtering.

Figure 12D:
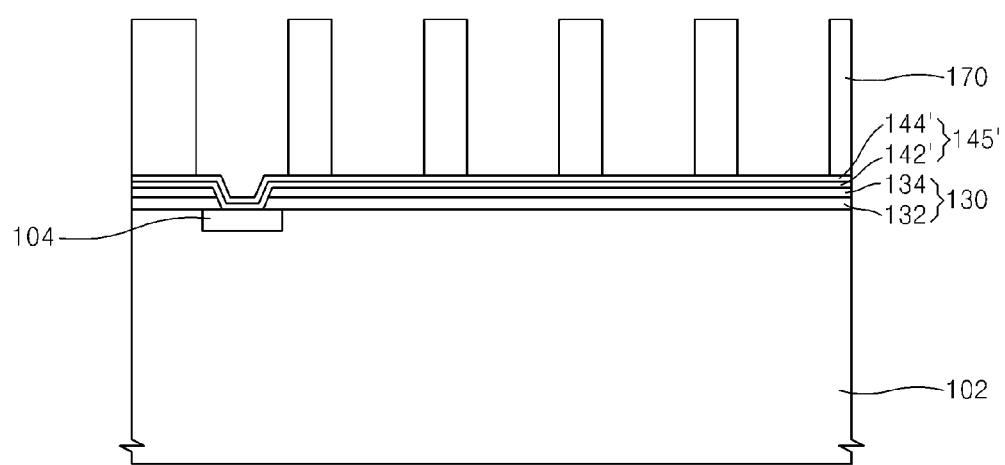

Referring to FIG. 12D, photoresist layers 170 are formed on the UBM layer 145' in a pattern to expose regions where through-bumps 110 and pseudo bumps 120 are to be formed. For example, a photoresist film (not illustrated) may be coated on the UBM layer 145' by using spin-coating. The photoresist film may be patterned into the photoresist layers 170 by using exposure and developing processes, to expose the regions where the through-bumps 110 and the pseudo bumps 120 are to be formed. The processes described above with reference to FIGS. 12A to 12D may be applied to fabricate the semiconductor chip 100a of FIG. 1. In order to fabricate the semiconductor chips 100b to 100g of FIGS. 3 to 8, the photoresist layers 170 may be formed in such a pattern as to define the regions where the through-bumps 110 and the pseudo pumps 120 are to be formed, to have different widths or to be spaced at different intervals.

Figure 12E:
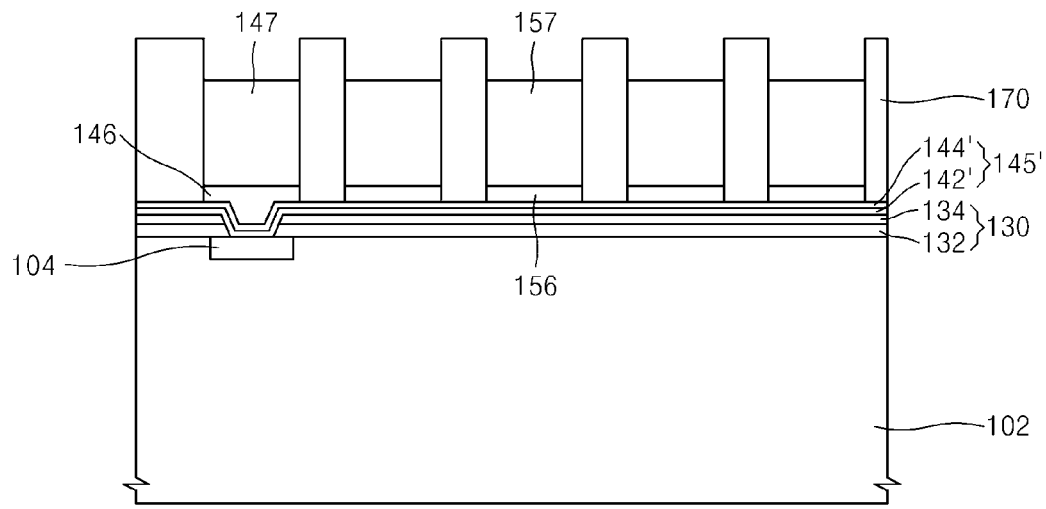

Referring to FIG. 12E, conductive fillers 146 and 156 may be formed on the exposed UBM layer 145', and particularly, on the exposed seed layer 144'. For example, the conductive fillers 146 and 156 may be formed on the seed layer 144' by using a plating process. Solder materials 147 and 157 may be applied onto the conductive fillers 146 and 156, respectively. For example, the solder materials 147 and 157 may be applied onto the conductive fillers 146 and 156, respectively, by using a plating process. For example, a solder lead may be applied by using inkjet printing using, for example, a solder jet.

Figure 12F:
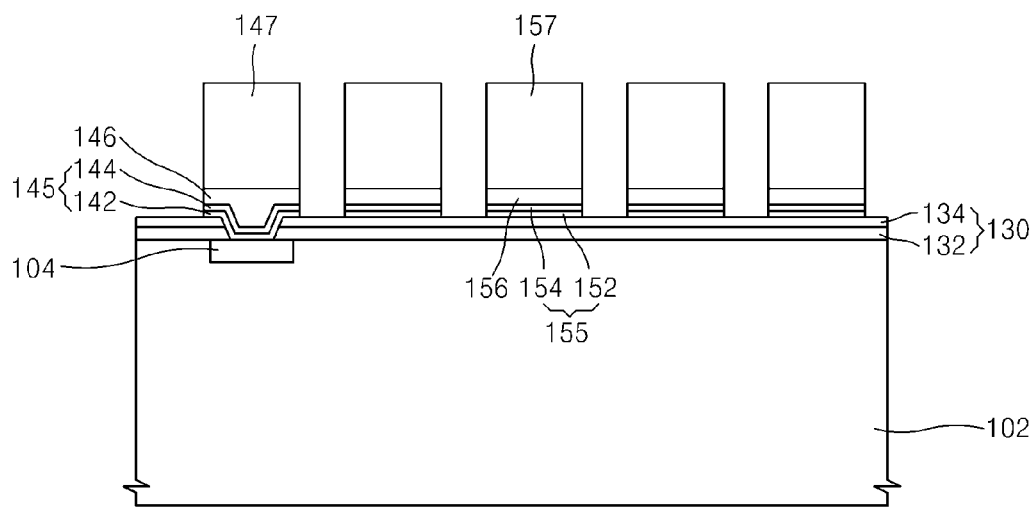

Referring to FIG. 12F, the photoresist layers 170 may be removed to expose the UBM layer 145'. The exposed UBM layer 145' may be patterned to form a second UBM layer 145 and first UBM layers 157 by using the solder materials 147 and 157 as etch masks. Thus, the second UMB layer 145 on which one through-bump 110 is to be formed, and the first UBM layers 155 on which the pseudo bumps 120 are to be formed, may be electrically insulated from each other. The solder materials 147 and 157 are reflowed to form the second and first solder layers 148 and 158, respectively, as illustrated in FIG. 2A. The solder materials 147 and 157 are melted in the reflowing process and flowed down onto the passivation film 130 between the second UBM layer 145 and the first UBM layers 155, and between the first UBM layers 155. Thus, the second and first solder layers 148 and 158 are connected, as illustrated in FIG. 2A. Through the processes described above, a redistribution interconnect formed by the pseudo bumps 120 may be formed on the passivation layer 130.

As described above, a redistribution interconnect may be constructed on the passivation film 130 by using only general bumping processes, without performing an additional redistribution process including photolithography and plating processes. Thus, no extra costs and time may incur, since such additional processes are unnecessary.

The second and first conductive pillar 146a and 156a according to the embodiment illustrated in FIG. 5 may be formed as follows. After the construction of FIG. 12D is obtained, a conductive material may be applied on the exposed UBM layer 145', and then the photoresist layers 170 are removed. The conductive material on the UBM layer 145' may then be isotropically etched. In isotropic etching, edge regions are removed more than a planar center region. Thus, the second and first plane conductive pillar 146a and 156a having the structure illustrated in FIG. 5 may be formed by using isotropic etching. A solder material may then be applied on the second and first conductive pillar 146a and 156a, having round edges, by using, for example, solder jetting. The solder material may be reflowed, thereby completing the fabrication of the semiconductor chip 100d of FIG. 5, including a redistribution interconnect formed by the pseudo bumps 120.

While the general inventive concept has been particularly illustrated and described with reference to exemplary embodiments thereof, it will be understood that various changes in form and details may be made therein without departing from the spirit and scope of the following claims.

What is claimed is:

1. A semiconductor chip comprising:
    a semiconductor substrate;
    a passivation film disposed on the semiconductor substrate;
    a plurality of pseudo bumps disposed on the passivation film;
    an interconnect disposed in the semiconductor substrate;
    at least one pad electrically connected to the interconnect and exposed through at least one opening of the passivation film; and
    at least one through-bump disposed to be electrically connected to the pad through the at least one opening of the passivation film,
    wherein the at least one through-bump is directly connected to at least one of the pseudo bumps,
    wherein the plurality of pseudo bumps are directly connected to each other to form at least one redistribution interconnect,
    wherein the plurality of pseudo bumps each comprises:
        a first under bump metallurgy (UBM) layer disposed on the passivation film; and
        a first solder layer disposed on the first UBM layer,
    wherein a plurality of first UBM layers have intervals therebetween, such that a plurality of first solder layers are disposed to cover the plurality of first UBM layers and the intervals therebetween to directly connect adjacent ones among the plurality of first solder layers,
    wherein the at least one through-bump each comprises a second UBM layer disposed on the at least one pad, and a second solder layer disposed on the second UBM layer, and the second UBM layer is disposed separated from the plurality of first UBM layers, and the second solder layer is directly connected to at least one of the plurality of first solder layers.

2. The semiconductor chip of claim 1, wherein the plurality of pseudo bumps each further comprises a conductive pillar disposed between the first UBM layer and the first solder layer.

3. The semiconductor chip of claim 2, wherein the conductive pillar has a convex upper surface having a larger height in a middle region than in edge regions thereof.

4. The semiconductor chip of claim 1, wherein a height of the first solder layers is greatest at the first UBM layers and smallest at the intervals between the first UBM layers.

5. The semiconductor chip of claim 1, wherein a height and width of the second solder layer are larger than those of the plurality of first solder layers.

6. The semiconductor chip of claim 1, wherein a width of the second UBM layer is larger than that of the plurality of first UBM layers.

7. The semiconductor chip of claim 1, wherein an interval between the second UBM layer and one of the first UBM layers adjacent to the second UBM layer is smaller than the interval between adjacent first UBM layers.

8. The semiconductor chip of claim 1, wherein the at least one through-bump comprises first and second through-bumps to which an equal voltage is applied, and
    the first and second through-bumps are electrically connected via a redistribution interconnect formed by the plurality of pseudo bumps.

9. The semiconductor chip of claim 8, wherein a ground voltage or a power voltage is applied to the interconnect via the first and second through-bumps.

10. The semiconductor chip of claim 1, further comprising at least one connection bump disposed on the passivation film and directly connected to at least one of the pseudo bumps,
    wherein the at least one connection bump is electrically connected to the at least one through-bump via a redistribution interconnect formed by the plurality of pseudo bumps.

11. The semiconductor chip of claim 10, wherein the at least one connection bump comprises a third UBM layer disposed on the passivation film, and a third solder layer disposed on the third UBM layer, and
    the third UBM layer is disposed separated from the first UBM layer, and the third solder layer is directly connected to at least one of the first solder layers.

12. The semiconductor chip of claim 11, wherein a height and width of the third solder layer are larger than those of the plurality of first solder layers.

13. The semiconductor chip of claim 11, wherein a width of the third UBM layer is larger than that of the plurality of first UBM layers.

14. The semiconductor chip of claim 11, wherein an interval between the third UBM layer and one of the first UBM layers adjacent to the third UBM layer is smaller than the interval between adjacent first UBM layers.

15. A system including a semiconductor chip comprising:
    a control unit to execute instructions for the system;
    an input/output unit to receive external data or signals and output data or signals from the system;
    a memory unit to store instructions to be executed in the control unit;
    an interface unit to receive and output data while communicating with a network; and
    a bus to connect the control unit, the input/output unit, the memory unit, and the interface unit,
    wherein at least one of the control unit, memory unit or interface unit includes a semiconductor chip comprising:
        a semiconductor substrate;
        a plurality of conductive pads formed within the semiconductor substrate;
        a passivation film disposed on the semiconductor substrate to cover the conductive pads;
        a plurality of through bumps disposed on the semiconductor substrate to penetrate the passivation film and establish electrical connection with the plurality of conductive pads; and
        a plurality of pseudo bumps disposed on the semiconductor substrate atop the passivation film and establishing electrical connection with the conductive pads via the through bumps;
    an interconnect disposed in the semiconductor substrate;

at least one pad electrically connected to the interconnect and exposed through at least one opening of the passivation film; and at least one through-bump disposed to be electrically connected to the pad through the at least one opening of the passivation film, wherein the at least one through-bump is directly connected to at least one of the pseudo bumps, wherein the plurality of pseudo bumps each comprises:
  a first under bump metallurgy (UBM) layer disposed on the passivation film; and
  a first solder layer disposed on the first UBM layer, wherein a plurality of first UBM layers have intervals therebetween, such that a plurality of first solder layers are disposed to cover the plurality of first UBM layers and the intervals therebetween to directly connect adjacent ones among the plurality of first solder layers, wherein the at least one through-bump each comprises a second UBM layer disposed on the at least one pad, and a second solder layer disposed on the second UBM layer, and the second UBM layer is disposed separated from the plurality of first UBM layers, and the second solder layer is directly connected to at least one of the plurality of first solder layers.

* * * * *